(12) United States Patent
Blom et al.

(10) Patent No.: US 7,767,776 B2
(45) Date of Patent: Aug. 3, 2010

(54) COPOLYMER FOR CHARGE TRANSPORT LAYER IN OPTO-ELECTRONIC DEVICE

(75) Inventors: Paulus Wilhelmus Maria Blom, Eindhoven (NL); Jurjen Wildeman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 602 days.

(21) Appl. No.: 11/577,814

(22) PCT Filed: Oct. 24, 2005

(86) PCT No.: PCT/IB2005/053471

§ 371 (c)(1),
(2), (4) Date: Apr. 24, 2007

(87) PCT Pub. No.: WO2006/046189

PCT Pub. Date: May 4, 2006

(65) Prior Publication Data

US 2009/0128007 A1 May 21, 2009

(51) Int. Cl.
*C08F 14/04* (2006.01)
(52) U.S. Cl. ............... 526/280; 428/690; 528/373; 528/396; 526/347.1
(58) Field of Classification Search ......... 528/380, 528/396, 373; 526/341.7; 313/504
See application file for complete search history.

(56) References Cited

U.S. PATENT DOCUMENTS

| | | | |
|---|---|---|---|
| 5,317,169 A | 5/1994 | Nakano et al. | |
| 5,807,627 A | 9/1998 | Friend et al. | |
| 5,948,552 A | 9/1999 | Antoniadis et al. | |
| 6,074,734 A | 6/2000 | Kawamura et al. | |
| 6,127,693 A | 10/2000 | Chen et al. | |
| 6,423,428 B1 | 7/2002 | Towns et al. | |
| 6,528,188 B1 | 3/2003 | Suzuki et al. | |
| 6,653,438 B1 | 11/2003 | Sprietzer et al. | |
| 6,723,811 B1 | 4/2004 | Holmes et al. | |
| 2002/0061420 A1 | 5/2002 | Sohn et al. | |

FOREIGN PATENT DOCUMENTS

| WO | 1999021935 | 5/1999 |
|---|---|---|
| WO | 0036004 | 6/2000 |

OTHER PUBLICATIONS

Martens HCF et al; "Comparative Study of Hole Transport in Poly(P-Phenylene Vinylene) Derivatives", Physical Review B, APS Through AIP US, vol. 61, No. 11, Mar. 15, 2000, pp. 7489-7493, XP008060100.

(Continued)

*Primary Examiner*—Randy Gulakowski
*Assistant Examiner*—Shane Fang

(57) ABSTRACT

The invention relates to a copolymer for a charge transport layer in an optoelectronic device and in particular in a light-emitting diode (LED), having a charge mobility of at least $1.0 \times 10^{10}$ m$^2$/V.s, and comprising at least a first and a second monomer, characterized in that the ratio of the solubilities of homopolymers made from the first and the second monomer in a first solvent is more than 10. This copolymer allows a (semi) conductive polymer to be cast to form a first layer and prevents it from being dissolved in the solvent of a subsequently deposited second, e.g. light-emitting layer. The invention further relates to a LED comprising a copolymer according to the invention.

5 Claims, 3 Drawing Sheets

OTHER PUBLICATIONS

Tanase C et al; "Enhancement of the Hole Transport in Poly(P-Phenylene Vinylene) Based Light-Emitting Diodes", Proceedings of the SPIE- The International Society for Optical Engineering SPIE-Int. Soc. Opt. Eng USA, vol. 5464, No. 1, pp. 351-355, Apr. 2004, XP008060085.

N.C. Greenham et al; "Efficient Light-Emitting Diodes Based on Polymers With High Electron Affinities", vol. 365, Oct. 14, 1993, pp. 628-630, XP002368375.

P W M. Blom et al; "Charge Transport in Poly(P-Phenylene Vinylene) Light-Emitting Diodes", vol. 27, pp. 53-94. 2000.

B. Domercq et al; "Organic Light-Emitting Diodes With Multiple Photocrosslinkable Hole-Transport Layers",Polymer Physics, vol. 41, pp. 2726-2732, 2003.

CF. Neef et al; "MEH-PPV: Improved Synthetic Procedure and Molecular Weight Control", vol. 33, pp. 2311-2314, Macromolecules 2000.

R. H. Friend; "Optical Investigations of Conjugated Polymers", Journal of Molecular Electronics, vol. 4, No. 1, pp. 37-46, 1988.

COPOLYMER FOR CHARGE TRANSPORT LAYER IN OPTO-ELECTRONIC DEVICE

FIELD OF THE INVENTION

The invention relates to a copolymer for a charge transport layer in an opto-electronic device and in particular in an electroluminescent device comprising an anode, a cathode, a light-emitting layer, and at least one charge transport layer. An opto-electronic device is understood to be any device that functions as an electrical-to-optical or optical-to-electrical transducer, or an instrument that uses such a device in its operation. Photodiodes, photodetectors, light-activated switches, electroluminescent devices (LEDs), injection laser diodes, and integrated optical circuit (IOC) elements are examples of opto-electronic devices commonly used e.g. in optical fiber communications. An electroluminescent device is characterized in that it emits light when a voltage is applied and current flows. Such devices have long been known as light-emitting diodes (LEDs). The emission of light is due to the fact that positive charges ("holes") and negative charges ("electrons") recombine, leading to the emission of light.

BACKGROUND OF THE INVENTION

Use was made of inorganic semiconductors, such as gallium arsenide, in the development of light-emitting diodes for electronics or photonics. In addition to semiconductor light-emitting diodes, organic LED's (OLED's) based on vapor-deposited or solution-processed organic compounds of low molecular weight were developed. Recently, conjugated oligomers and polymers based on e.g. substituted p-divinylbenzene, poly(p-phenylenes) and poly(p-phenylenevinylenes) (PPV), polyfluorenes, and poly(spirofluorene)s were described for the manufacture of a polymer LED (polyLED). By 'conjugated polymer' is meant a polymer which possesses a delocalized $\pi$-electron system along the polymer backbone; said delocalized $\pi$-electron system conferring semiconducting properties on the polymer and giving it the ability to transport positive and negative charge carriers with high mobilities along the polymer chain. Such polymers are discussed, for example, by R. H. Friend in Journal of Molecular Electronics 4 (1988) January-March, No. 1, pages 37 to 46.

Until now the most primary organic LED device have comprised a single organic light-emitting layer which is interposed between a transparent electrode as the anode and a metal electrode as the cathode. The organic LED device may have two additional organic layers in order to enhance its emission efficiency, the first layer as a hole transport layer and the second layer as an organic light-emitting layer, or the first layer as an organic light-emitting layer and the second layer as an electron transport layer. These two organic layers are interposed between a transparent anode and a metal cathode. Furthermore, there are devices having three organic layers: the hole transport layer, the organic light-emitting layer, and the electron transport layer in that order, which are interposed between the two electrodes.

In a typical device, a polyLED comprises a hole transport layer, for example a conjugated polymer layer, and a layer of a light-emitting polymer (LEP). The charge mobility of the LEP generally is a compromise between low power, favoring high mobility, and high efficiency, favoring low mobility. The charge mobility of the charge transport layer typically is at least one order of magnitude greater than the charge mobility of the light-emitting layer.

Spin casting is preferably used for the application of the different layers. A major problem for polymer-based multilayer devices is the solubility of the materials used; a multilayer device cannot be realised if a spin-cast first layer dissolves in the solvent of a subsequent second layer. As a first approach, efficient bi-layer devices have been realized by N. C. Greenham et al., Nature 1993, 365, 628, using a precursor PPV as hole transport layer, which is insoluble after conversion. Another approach to overcome the solubility problem is to crosslink the first (hole transport) layer after deposition. However, the long UV exposure and reactive end groups needed for crosslinking strongly decreases the performance of LEDs fabricated from these materials as described by B. Domercq et al. in J. Polym. Sc., Part B: Polym. Phys. 2003, 41, 2726. Therefore, there is a need for materials for light-emitting and charge transport layers such that a spin-coated first layer does not dissolve in the subsequently deposited second layer.

SUMMARY OF THE INVENTION

An object of the invention is to provide a (semi) conductive polymer that can be spin cast to a first layer but does not dissolve in the solvent of a subsequently deposited second, for example light-emitting layer.

According to the invention, a copolymer prepared for use in a charge transport layer in an opto-electronic device and in particular in a light-emitting diode (LED), having a charge mobility of at least $1.0 \times 10^{-10}$ m$^2$/V.s, and comprising at least a first and a second monomer, is characterized in that the ratio of the solubilities of homopolymers made from the first and the second monomer in a first solvent is more than 10, preferably more than 25, and more preferably more than 50.

A copolymer according to the invention constitutes a (semi) conductive polymer whose solubility in a first solvent can be reduced by varying the amount of a built-in second monomer. The second monomer is chosen such that a homopolymer made from the second monomer is highly insoluble in the first solvent.

It has been demonstrated that charge transport in e.g. PPV derivatives can be enhanced by the use of long symmetrical side-chains. However, applying long symmetrical side chains does not reduce the solubility of the polymer. Reduction of the solubility can be achieved by addition of monomers with symmetrical short side chains. This can surprisingly be done without jeopardizing the enhanced charge transport properties. Consequently, the solubility in a first solvent can be continuously adjusted by a tuning of the mutual ratio of the monomers having long and short (symmetrical) side chains, while preserving the enhanced charge transport properties and the solubility in a second solvent. In this way, a charge transport layer can be chosen to have lower solubility in a first solvent than the highly luminescent LEP layer in the same first solvent. This charge transport layer, with limited solubility in a first solvent, can be spin cast in a second solvent and can then be easily combined with a thin, highly luminescent layer spin cast with the first solvent.

In order to be able to apply the copolymer according to the invention by spin coating, the amount of the second monomer should be such that the copolymer is still soluble in a second solvent. Preferably, the molar ratio of the first and the second monomer is chosen such that the ratio of the solubilities of the copolymer in a first solvent and in a second solvent is less than 0.2, preferably less than 0.1. A first and a second solvent are preferably chosen such that one of the solvents is a more polar solvent than the other one.

The (semi) conductive polymer for the light-emitting substance may be an organic semi conductor of low molecular weight, or an oligomer or polymer semi conductor. Examples of suitable light emitting organic semi conductors of low-molecular-weight are e.g. dendrimers as described in WO 99/21935.

Examples of oligomer and polymer semiconductors used in light-emitting layers and in charge transport layers are (substituted) p-divinylbenzene, poly(p-phenylenes) and poly (p-phenylenevinylenes) (PPVs) (e.g. described in U.S. Pat. No. 6,423,428), polythiophenes (e.g. U.S. Pat. No. 6,723,811), polyfluorenes and poly(spirofluorene)s (e.g. U.S. Pat. No. 6,653,438). Preferably, the monomers are chosen such that homopolymers made thereof belong to the group of different substitutes of p-divinylbenzenes, poly(p-phenylenes), poly(p-phenylenevinylenes), polythiophenes, polyfluorenes, and poly(spirofluorene)s.

The copolymers of the invention may easily be selected from the group of compounds comprising mixtures of two or more monomers and? homopolymers with a solubility ratio in a first solvent of at least 10.

The invention particularly relates to a light-emitting diode comprising an anode electrode, a cathode electrode, a light-emitting layer, and at least one charge transport layer, characterized in that the charge transport layer comprises a copolymer according to the invention.

DESCRIPTION OF THE PREFERRED EMBODIMENTS

Although the preferred embodiments relate to a light-emitting device (LED), the copolymer of the invention may be used in other opto-electrical devices comprising more than one layer of a conjugated polymer.

Polymer synthesis: MEH-PPV, BEH-PPV, and BEH/BB-PPV ⅓ were synthesized according to the procedure of MEH-PPV in the presence of 0.5-1.0% of 4-methoxyphenol, by Neef et al. in *Macromolecules* 2000, 33, 2311. The structures of the polymers used are shown below. The precursors were carefully purified by crystallization (3×) and the obtained polymers were purified by a second precipitation from acetone. NRS-PPV has been synthesized according to the procedure indicated in *Adv. Mater.* 1998, 10, 1340.

Polymer analysis: Molecular weights were determined by gel permeation chromatography (GPC); they were measured in trichlorobenzene at 135° C. and calibrated with polystyrene standards.

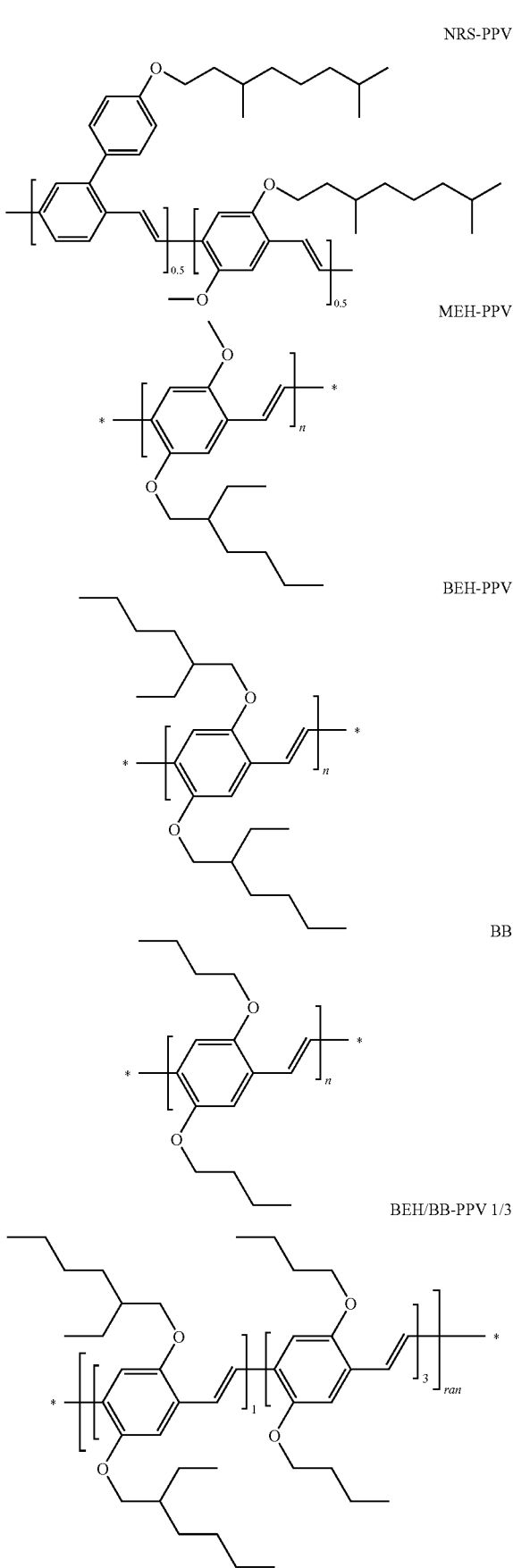

The combination of BEH-PPV and BB-PPV in various ratios in copolymers can induce a variation from insoluble in toluene (pure BB-PPV) to highly soluble in toluene (pure BEH-PPV), depending on the amount of BB-PPV in the copolymer. The solubility in toluene of BEH/BB-PPV in various ratios 1:x (x=1 to 3) drops from 0.2% for BEH/BB-PPV 1/1 to less than 0.1% for BEH/BB-PPV ⅓.

Poly[{2-(4-(3',7'-dimethyloctyloxyphenyl))}-co-{2-methoxy-5-(3',7'-dimethyloctyloxy)}-1,4-phenylenevinylene] (NRS-PPV) used in the devices is soluble in a wide range of solvents with a hole mobility of only $1.5 \times 10^{-12}$ m$^2$/V s at low electric fields at room temperature when spin-coated from toluene.

Figure 1:
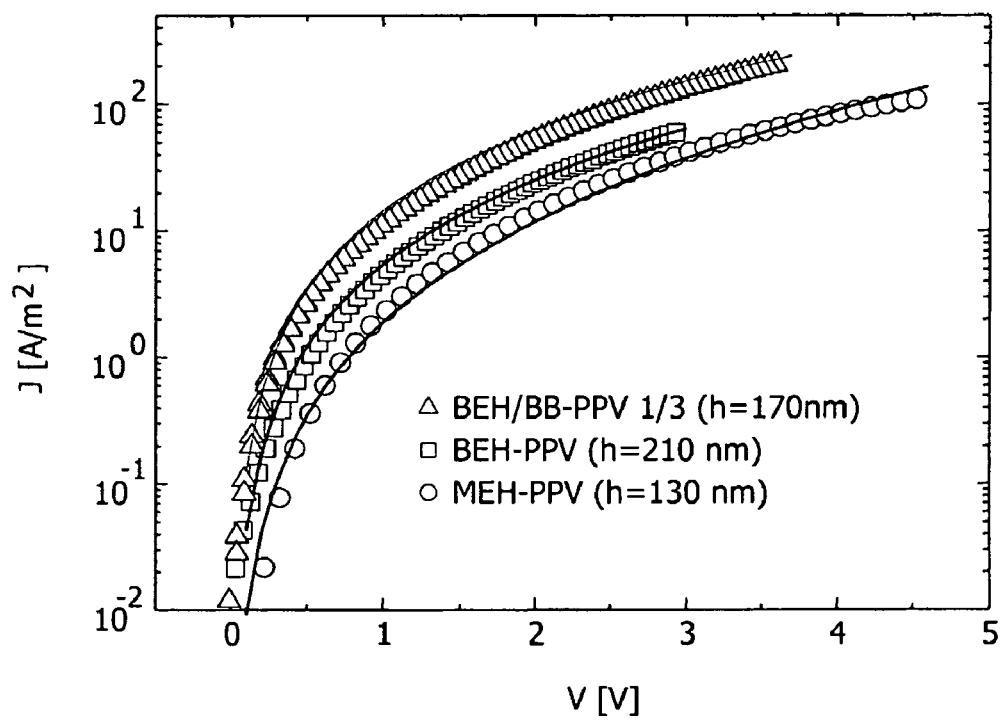
FIG. 1 shows current density vs. voltage characteristics at room temperature of MEH-PPV, BEH-PPV, and BEH/BB-PPV ⅓ hole-only diodes.

The analysis of the J-V measurements as shown in FIG. 1 with a space-charge limited model (SCL) as described by P. W. M. Blom et al. in *Mat. Sc. and Engineering* 2000, 27, 53, provides direct information about the hole mobility. The solid lines represent the best fit with the SCL model, based on the hole mobility as a single parameter. At low electric fields at room temperature, the hole mobility in MEH-PPV amounts to $5 \times 10^{-11}$ m$^2$V s.

Table 1 below lists the mobility, molecular weight and the solubility of the polymers.

TABLE 1

| Polymer | $\mu(E=0)_{RT}$ | Mw [g/mol] | Mn [g/mol] | Solubility (%) Toluene | Cloroform |
|---|---|---|---|---|---|
| NRS-PPV | $1.5 \times 10^{-12}$ | $1.0 \times 10^6$ | $1.9 \times 10^5$ | 1 | 1 |
| MEH-PPV | $5.0 \times 10^{-11}$ | $2.1 \times 10^5$ | $6.3 \times 10^4$ | 1 | 1 |
| BEH-PPV | $1.5 \times 10^{-9}$ | $5.5 \times 10^5$ | $1.3 \times 10^5$ | 1 | 1 |
| BB | — | — | — | 0 | 0.2 |
| BEH/BB-PPV 1/3 | $1.2 \times 10^{-9}$ | $5.7 \times 10^5$ | $4.2 \times 10^5$ | <0.1 | 0.6 |

Light-emitting device preparation. Pre-patterned glass/ITO-substrates were cleaned ultrasonically in acetone and isopropyl alcohol and given a UV-ozone treatment. The charge transport layer (BEH/BB-PPV) was spin cast from a chloroform solution in a N$_2$ atmosphere. The light-emitting layer (NRS-PPV) was spin cast from a toluene solution. Finally, a ~5 nm Ba layer and a ~100 ml Al protecting layer for LEDs and ~80 nm Au layer for hole-only diodes were deposited by thermal evaporation under vacuum ($1 \times 10^{-6}$ mbar).

Device characterization: Polymer thickness was measured with a Dektak profile analyzer. The active area of the devices varied between 7.6 and 99 mm$^2$. The electrical measurements were performed with a Keithley 2400 Sourcemeter in a N$_2$ atmosphere. The light output was recorded by a calibrated photodiode connected to a Keithley 6514 electrometer. The current density-voltage (J-V) characteristics of these and of hole-only devices were obtained in a nitrogen atmosphere within a temperature range of 190-300 K. All the measurements were performed within a few hours after the preparation of the samples in order to avoid oxidation of the polymer or the metal. The analysis of the J-V measurements with a space-charge limited (SCL) model as described in P. W. M. Blom et al., *Mat. Sc. and Engineering* 2000, 27, 53, provides direct information about the hole mobility

DETAILED DESCRIPTION OF THE DRAWINGS

FIG. 1 shows current-density vs. voltage characteristics at room temperature of an MEH-PPV, BEH-PPV, and BEH/BB-PPV ⅓ hole-only diode. The solid lines represent the prediction from the SCL model including the density-dependent mobility. The current density depends strongly on both the applied bias voltage and the temperature. At low electric fields, the hole mobility in MEH-PPV amounts to $5 \times 10^{-11}$ m$^2$V s at room temperature.

Chemical modification of the PPV influences the interchain distance, orientation, and packing of the polymer chains and hence affects the charge carrier mobility of the polymer in devices. This has already been demonstrated for derivatives of OC$_1$C$_{10}$-PPV in which the hole mobility could be varied over more than two orders of magnitude. The highest mobility of $6 \times 10^{-10}$ m$^2$/Vs was achieved in a symmetrical OC$_{10}$C$_{10}$-PPV compound.

In order to make a material with good charge transport properties, a symmetrically substituted PPV derivative was prepared, namely poly[2,5-bis(2'-ethylhexyloxy)-1,4-phenylenevinylene] (BEH-PPV). The difference between BEH-PPV and MEH-PPV is the substitution pattern of the side chain: MeO was replaced by 2-ethylhexyloxy. FIG. 1 shows the J-V characteristics at room temperature of a BEH-PPV hole-only diode. The hole mobility of BEH-PPV amounts to $1.5 \times 10^{-9}$ m$^2$ V. s, which is 20 times higher than the hole mobility in MEH-PPV.

From the mobility point of view, BEH-PPV is a material with good transport layer properties due to its high hole mobility, but its long side chains make it soluble in many common solvent such as toluene or chloroform. The solubility has been reduced by replacing the (2-ethylhexyloxy) sidechains with (butoxy) side-chains. However, the poly[2,5-bis(butoxy)-1,4-phenylenevinylene] (BB) is only soluble in chloroform (see Table I), and indeed only in very low concentrations. No diodes can be fabricated from this material because of this very poor solubility.

The combination of BEH-PPV and BB in various ratios in copolymers induces a variation from insoluble in toluene (pure BB), to highly soluble in toluene (pure BEH-PPV), depending on the amount of BB in the copolymer. The solubility in toluene of BEH/BB-PPV in various ratios 1:x (x=1 to 3) drops from 0.2% for BEH/BB-PPV 1/1 to less than 0.1% for BEH/BB-PPV ⅓. SCL J-V measurements show that the hole mobility for all copolymers is about equal to that of BEH-PPV: $1.5 \times 10^{-9}$ m$^2$/Vs at room temperature (cf. FIG. 1). As a result, BEH/BB-PPV ⅓ combines the desired properties for a hole transport layer in a PLED: a high mobility, and a limited solubility.

Figure 2:
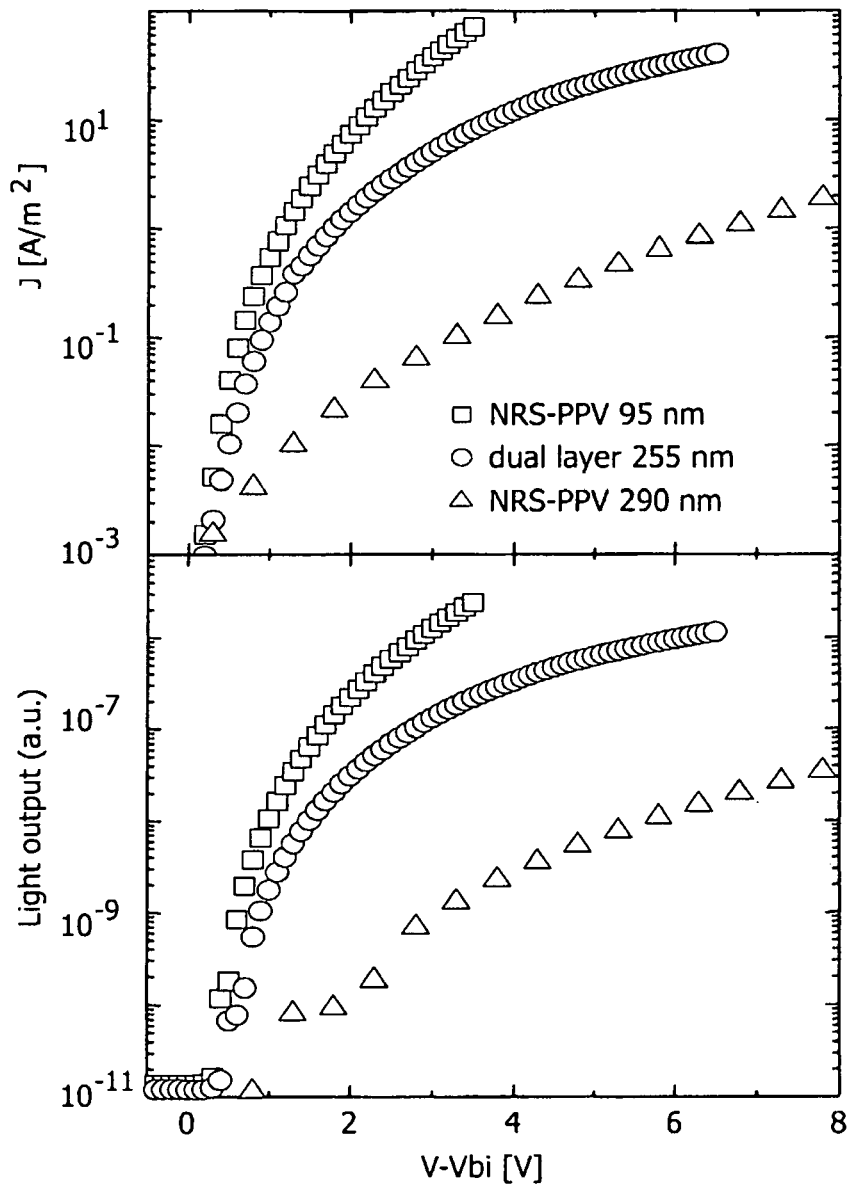
FIG. 2 shows current density vs. voltage (J-V) characteristics of NRS-PPV and dual layer LED at room temperature (a), together with light output (b).

A dual polymer layer LED was constructed using BEH/BB-PPV ⅓ as a hole transport layer and NRS-PPV as an emission layer. FIG. 2 shows the J-V characteristics of a single-layer NRS-PPV LED with thickness 95 nm and a double layer of BEH/BB-PPV ⅓ and NRS-PPV based LED (FIG. 2a) together with the light output (FIG. 2b). The thickness of the layers in the dual-layer diode are 160 nm for BEH/BB-PPV ⅓ and 95 nm for NRS. For reference, the data of a single-layer NRS-based LED with a thickness comparable to that of the dual-layer device is also shown. When a bias is applied to the diode, the holes are efficiently transported through the BEH/BB-PPV ⅓ and subsequently recombine with electrons in the NRS-PPV layer. The holes can enter the NRS-PPV directly and are not hindered by an energy barrier at the interface, since the HOMO and LUMO levels of the two polymers align. It is apparent from FIG. 6a that at the same operating voltage both the current density and the light output of the double layer are significantly smaller than those of the single-layer NRS-PPV diode of 95 nm. Since the current in the BEH/BB-PPV is space-charge limited, a very low voltage drop across this layer implies that electrostatically only a small amount of charge carriers is allowed in this layer. Therefore, in order to make the hole transport layer highly conductive, a certain voltage drop across this layer is required to fill up the layer with charge carriers.

Figure 3:
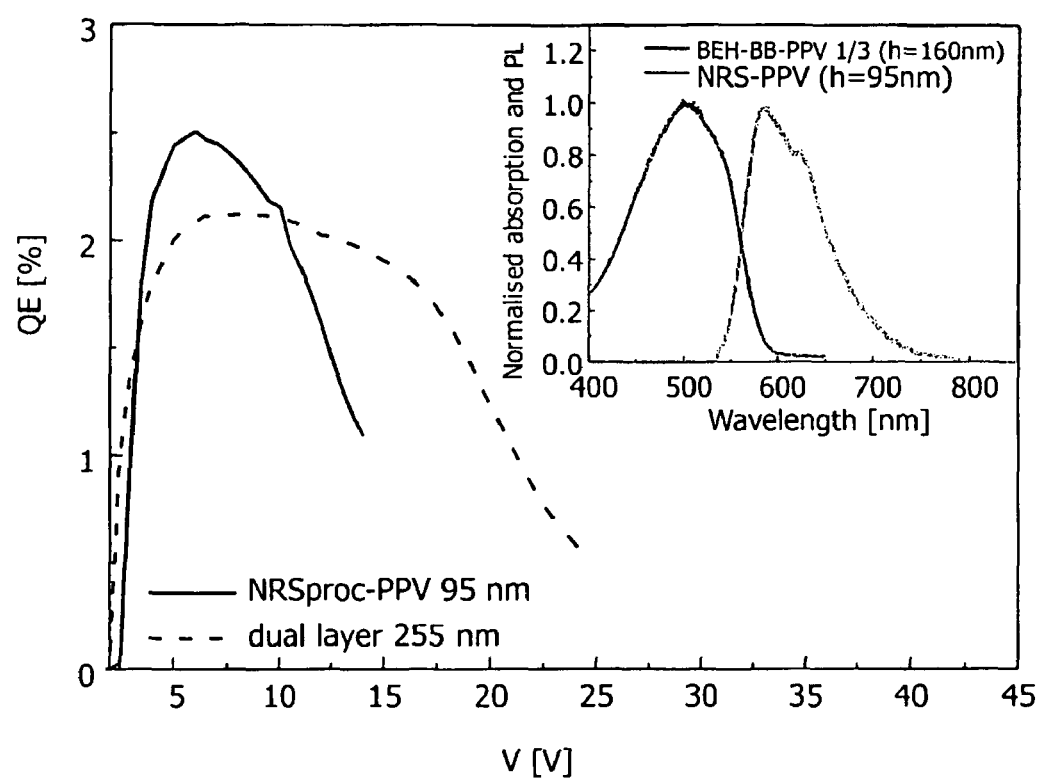
FIG. 3 shows the quantum efficiency as a function of an applied bias for NRS-PPV and dual layer LEDs. The inside shows the absorption of BEH/BB-PPV ⅓ and PL of NRS-PPV.

FIG. 3 shows the quantum efficiency (QE) (photon/charge carrier) as a function of an applied bias for NRS-PPV and dual-layer LEDs. The inside shows the absorption of BEH/BB-PPV ⅓ and PL of NRS-PPV. Since the HOMO and LUMO levels of the hole transport and luminescent layers are aligned, the electrons are not blocked at their interface. Therefore, a small portion of the electroluminescence is generated in the low-luminescence BEH/BB-PPV layer, thereby reducing the maximum quantum efficiency of the device. The advantage of using aligned energy levels is that it strongly simplifies the analysis of the performance of this dual-layer test device. For V>7 V, the efficiency of the single-layer NRS-PPV PLED drops very fast, due to the strong quenching of the luminescence efficiency at high fields. Finally, the single-layer device typically breaks down at 12 to 13 V. The efficiency of the dual-layer device only gradually decreases from 7 V to 18 V; the device according to the invention finally breaks down at 25 to 26 V. At 10 V the efficiency of the two devices is the same, at a typical light output of ~10 000 cd/m$^2$. The increased efficiency at high voltages as well as the increased robustness clearly demonstrates the potential of multilayer devices.

The invention claimed is:

1. A copolymer prepared for use in a charge transport layer in an opto-electronic device and in particular in a light-emitting diode (LED), having a charge mobility of at least $1.0 \times 10^{-10}$ m$^2$/V.s, and comprising at least a first and a second monomer, characterized in that the ratio of the solubilities of homopolymers made from the first and the second monomer in a first solvent is more than 10, wherein the homopolymers of the first and the second monomer are 2,5-bis(2'-ethylhexyloxy)-1,4-phenylenevinylene and 2,5-bis(butoxy)-1,4-phenylenevinylene, respectively, and the ratio of the first to the second monomer is between 1:1 and 1:3.

2. Copolymer according to claim 1, wherein the molar ratio of the first to the second monomer is chosen such that the ratio of the solubilities of the copolymer in a first solvent and in a second solvent is less than 0.2.

3. Copolymer according to claim 1, wherein the ratio of the first to the second monomer is 1:3.

4. Light-emitting diode comprising an anode electrode, a cathode electrode, a light-emitting layer, and at least one charge transport layer, wherein the charge transport layer comprise a copolymer as claimed in claim 1.

5. Copolymer according to claim 1, wherein the molar ratio of the first to the second monomer is chosen such that the ratio of the solubilities of the copolymer in a first solvent and in a second solvent is less than 0.1.

* * * * *